United States Patent [19]
Aulenbacher et al.

[11] Patent Number: 5,140,331
[45] Date of Patent: Aug. 18, 1992

[54] RADAR ANTENNA ARRANGEMENT

[75] Inventors: Uwe Aulenbacher, Celle; Heinz Chaloupka, Bochum, both of Fed. Rep. of Germany

[73] Assignee: TZN Forschungs- und Entwicklungszentrum Unterluss GmbH, Unterluss, Fed. Rep. of Germany

[21] Appl. No.: 796,600

[22] Filed: Nov. 22, 1991

[30] Foreign Application Priority Data

Nov. 22, 1990 [DE] Fed. Rep. of Germany ....... 4037156

[51] Int. Cl.⁵ .............................. G01S 7/40
[52] U.S. Cl. .................... 342/165; 342/192
[58] Field of Search .............. 342/165, 175, 192

[56] References Cited

U.S. PATENT DOCUMENTS

| | | | |
|---|---|---|---|
| 2,961,654 | 11/1960 | Simon | 342/165 |
| 3,158,861 | 11/1964 | Iribe | 342/165 |
| 4,860,016 | 8/1989 | Westphal et al. | 342/165 X |
| 4,879,560 | 11/1989 | McHenry | 342/165 |

Primary Examiner—Gilberto Barrén, Jr.
Attorney, Agent, or Firm—Spencer, Frank & Schneider

[57] ABSTRACT

A radar antenna arrangement (1) for a determination of the effective radar backscatter cross section $\sigma_{eff}$ of radar targets (2) as a function of the geometrical position of the target with reference to the radar antenna arrangement to be able to determine the effective radar backscatter cross section in a simple manner, even for a case where the radar beam no longer fully illuminates the radar target (2) to be examined and the position of the phase center (15) of the antenna (11) changes relative to the target (2), the radar antenna (11) is arranged on a rotatable antenna platform (10) outside of the rotation axis (12) of the antenna platform (10). In order to be able to scan the entire radar target (2) successively in time, the antenna platform (10) is pivotal about two axes (13, 14) that are perpendicular to the rotation axis (12). The radar target (2) to be examined is disposed on a revolving platform (3) which likewise rotates during the measuring process. A method for determining the effective radar backscatter of a radar target using this arrangement is additionally disclosed.

6 Claims, 10 Drawing Sheets

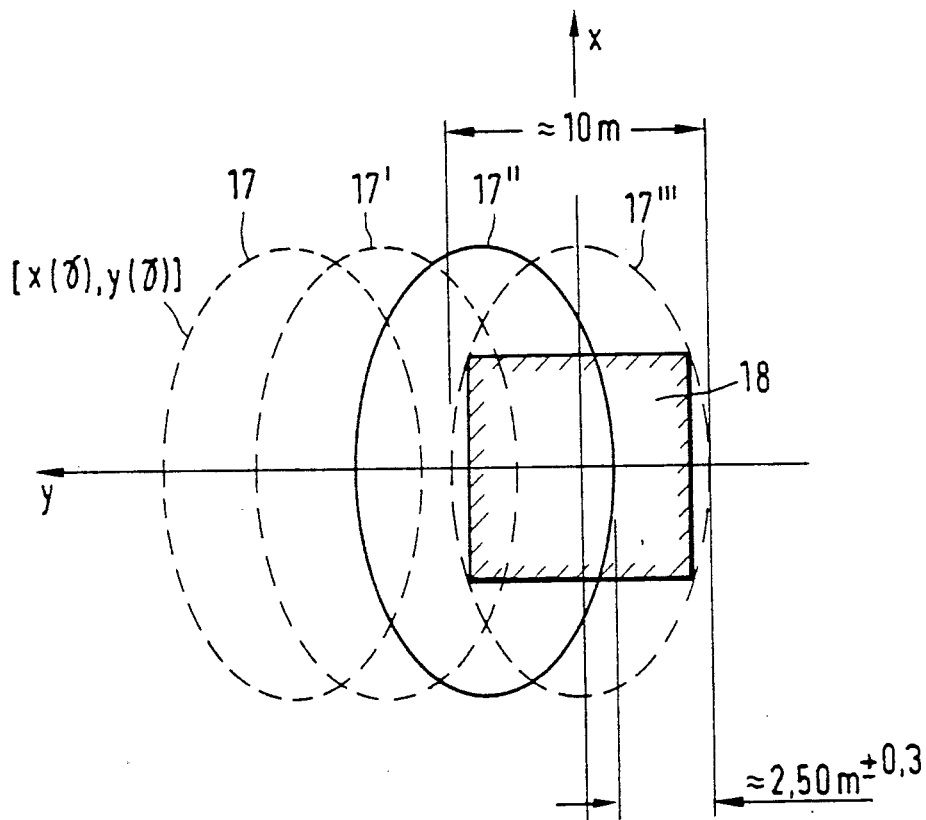
FIG.3
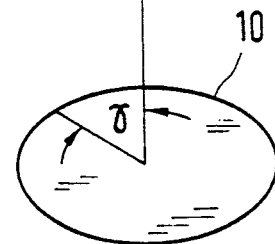

$\vec{r}_z = \vec{R}_A + \vec{u}_i \cdot v \cdot \delta_P$
($v$: = number of distance gate
$\delta_P$: = distance increment

RADAR ANTENNA ARRANGEMENT

REFERENCE TO RELATED APPLICATION

This application claims the priority of Federal Republic of Germany Ser. No. 40 37 156.7 filed Nov. 2nd, 1990, which is incorporated herein by reference.

BACKGROUND OF THE INVENTION

The present invention relates to a radar antenna arrangement and a method, using the antenna arrangement, for determining the effective radar backscatter cross section of a radar target as a function of the geometrical position of the target relative to the radar antenna.

In order to determine the behavior of the radar reflection cross section $\sigma$ of a target as a function of the aspect angle, it is known to measure the radar energy scattered back from the target as a function of the aspect angle (for a constant distance and a constant elevation angle). However, in this method it is assumed that the target is fully illuminated and is disposed in the far field of the receiving antenna.

The term "radar backscatter cross section" is defined particularly for such a case; the target acts as a single reflector (point source). If the expanse of the target is significantly greater than the wavelength, the radar backscatter cross section is greatly dependent on the aspect angle. This angle dependence is independent of the distance.

If the target is not fully illuminated by the radar beam, for example, because the antenna is sharply focused, the target must be scanned by the radar beam, with only part of the target being illuminated during each scanning process. The radar backscatter cross section measured in this case does, of course, not describe the radar backscatter behavior of the entire radar target, but only that part of the target that is illuminated by half to all of the 3dB antenna beam area. This is then called the effective radar cross section $\sigma_{eff}$. This term is also employed if the receiving antenna is disposed in the near field of the illuminated target or target section. The near field is that distance R for which the following applies:

$$R < \frac{2 a^2}{\lambda}$$

where a = the diameter of the target and $\lambda$ = the wavelength.

Knowledge of only one value oeff, measured for a given position of the target relative to the radar device, does not permit a conclusion as to oeff values for other positions of the target relative to the radar device, particularly if the distance or the resolution cell varies, e.g., because other parts of the target are illuminated. Such a problem exists, for example, if the behavior of a rotating search head of an ammunition body that is descending on a parachute and scans a target area with the aid of a millimeter-wave radar device is to be determined. In that case, the phase point of the antenna in space changes continuously, on the one hand, and, due to the intensive bundling of the radar beam, on the other hand, the target is illuminated only partially. Finally, the wavelength is generally much smaller than the target dimensions, e.g., a tank, and the receiving antenna is located in the near field of the target.

SUMMARY OF THE INVENTION

It is therefore an object of the invention to provide a device with which it is possible to determine the effective radar reflection cross section in a simple manner if the radar target to be examined is no longer illuminated uniformly by the radar beam and the position of the antenna phase center changes relative to the target. Moreover, the case is to be considered where the wavelength of the radar beam is significantly shorter than the target dimensions.

It is another object of the invention to provide a method which makes it possible to utilize the values measured by means of the device according to the invention to construct a model with which an effective reflection cross section associated with the target can be determined so that the target behavior can later be simulated under various conditions.

These conditions include:
variable distance of the radar vehicle at an elevation angle of $\beta \sim \beta_0$;
variable azimuth angle of $0° \leq \alpha \leq 360°$; and
variable antenna aperture angle and the like.

The above object with respect to the device is achieved by an arrangement for use in determining the effective radar backscatter cross section oeff of a radar target as a function of the geometric position of the target with respect to a radar antenna, which arrangement comprises a revolving target platform on which a radar target to be examined is disposed, a radar antenna platform, means for mounting the antenna platform for rotation about a rotation axis and for pivotal movement about two different axes that are respectively perpendicular to rotation axis so that the entire radar target can be scanned successively in time, and a radar antenna disposed on the antenna platform outside of the rotation axis of the antenna platform.

According to preferred features of the above arrangement, the antenna has a main beam direction whose axis is inclined with respect to the rotation axis of the antenna platform, with the respective inclination angle $\delta$ being selected such that during the time periods in which the position of a resolution cell relative to the radar target changes only insignificantly, the aspect angle at which a phase center of the radar antenna is viewed from the radar target passes through a predetermined angle range with respect to azimuth $\alpha$ and elevation $\beta$.

Preferably an FM-CW radar system or a pulse Doppler radar system is connected to the radar antenna device for the determination of the effective radar backscatter cross section, the revolving target platform is a horizontal platform, the antenna platform is mounted so that it is above and laterally displaced from the revolving platform, e.g. on top of a tower, and the rotation axis of the antenna platform is oriented transverse to the axis of rotation of the revolving target platform.

The above object with respect to the method of determining the effective radar backscatter cross section of a target is achieved by employing the arrangement discussed above and by:

(a) measuring the time-dependent radar echo signals u(t) as a function of the position of the antenna platform and the position of the revolving platform and subjecting the echo signals to a Fourier transform;

(b) determining the median and variance from the echo data that belong to the respective (discretized)

spatial position of the resolution cell and to the respective aspect angle range Δα;

(c) associating the medians and the variances with the respective center of the resolution cell for each aspect angle range to form a three-dimensional image function of the medians and a three-dimensional image function of the variances which are associated with predetermined geometrical positions of scattering centers $r_i$ representative of the back-scatter behavior of the target;

(d) describing the point-shaped local radar cross sections per aspect angle range by the median of the radar cross section and its variance; and (e) from the information about the median and the variance of the local radar cross section, determining the median and the variance of the effective radar cross section with the aid of a weighting process for a given resolution cell and a given aspect angle range.

The invention is based on the a priori information that the radar target can be modelled by an assembly of I independent point-shaped scattering centers that are distributed on the target geometry. The number of point sources should here be as small as possible. Their geometrical position is customarily selected so that it lies at points of the target that scatter heavily. The values of the radar reflection cross sections of the individual point sources in each case apply for a fixed aspect angle, for example, $\Delta = 3$. in azimuth, and thus changes when this range changes. As a whole, a target model then always has $360 \div 3 = 120$ different aspect angle ranges (or 60 different aspect angle ranges, if the radar target has a plane of symmetry).

In order to be able to meet the requirements for model formation, a few assumptions must be made regarding the statistics of the fluctuations of the radar cross section with the aspect angle. The statistical assumptions are dependent on the ratio of wavelength to type, magnitude and nature of the object or target. In principle, it is assumed that within an aspect angle range, the radar cross section $\sigma_i$ of the $i^{th}$ point source is composed of the superposition of a coherent component $\sigma_i^k$ and an incoherent (diffuse) component $\sigma_i^{NK}$. For the embodiment to be described in greater detail below, the variation is calculated with the aspect angle (in the azimuth within a range of, for example, 3° and with a sufficiently great variation of the elevation angle) by the following distribution function:

$$P(\sigma_i) = \frac{1}{<\sigma_i^K>} \exp\left[\frac{\sigma_i - \sigma_i^{NK}}{<\sigma_i^K>}\right]$$

The diffuse (incoherent) component is assumed to be constant within an aspect angle range of a width, in the present example, of $\Delta\alpha = 3°$. The source for an aspect angle range is thus described completely by two real parameters, namely the median of the coherent component $<\sigma_i^K>$ and of the incoherent component $\sigma_i^{NK}$. The variance of $\sigma_i$ is here related to $<\sigma_i^K>$ as follows:

$$<(\sigma_i - <\sigma_i>)^2> = <\sigma_i^K>^2$$

A mathematical discussion of the effective radar backscatter cross section is attached as Appendices 1.3 and 1.4.

A complete description of the backscatter over all aspect angle ranges thus requires the provision of $I \times 120 \times 2$ real parameters. As indicated above, this number is cut in half if there exists a plane of symmetry.

Further advantages and details will now be described below in greater detail for an embodiment of the invention and with reference to drawing figures.

BRIEF DESCRIPTION OF THE DRAWINGS

FIGS. 2 to 6 show various schematic representations to explain the method according to the invention with FIG. 2 showing the geometrical configuration for recording of an echo signal for a given inclination of the antenna platform of FIG. 1, FIGS. 3 and 4 being schematic top view of the measuring arrangement of FIG. 2, FIG. 5 being a side view of the antenna and antenna platform, and FIG. 6 showing a grid used to calculate a discrete averaged image function.

DETAILED DESCRIPTION OF THE PREFERRED EMBODIMENTS

Figure 1:
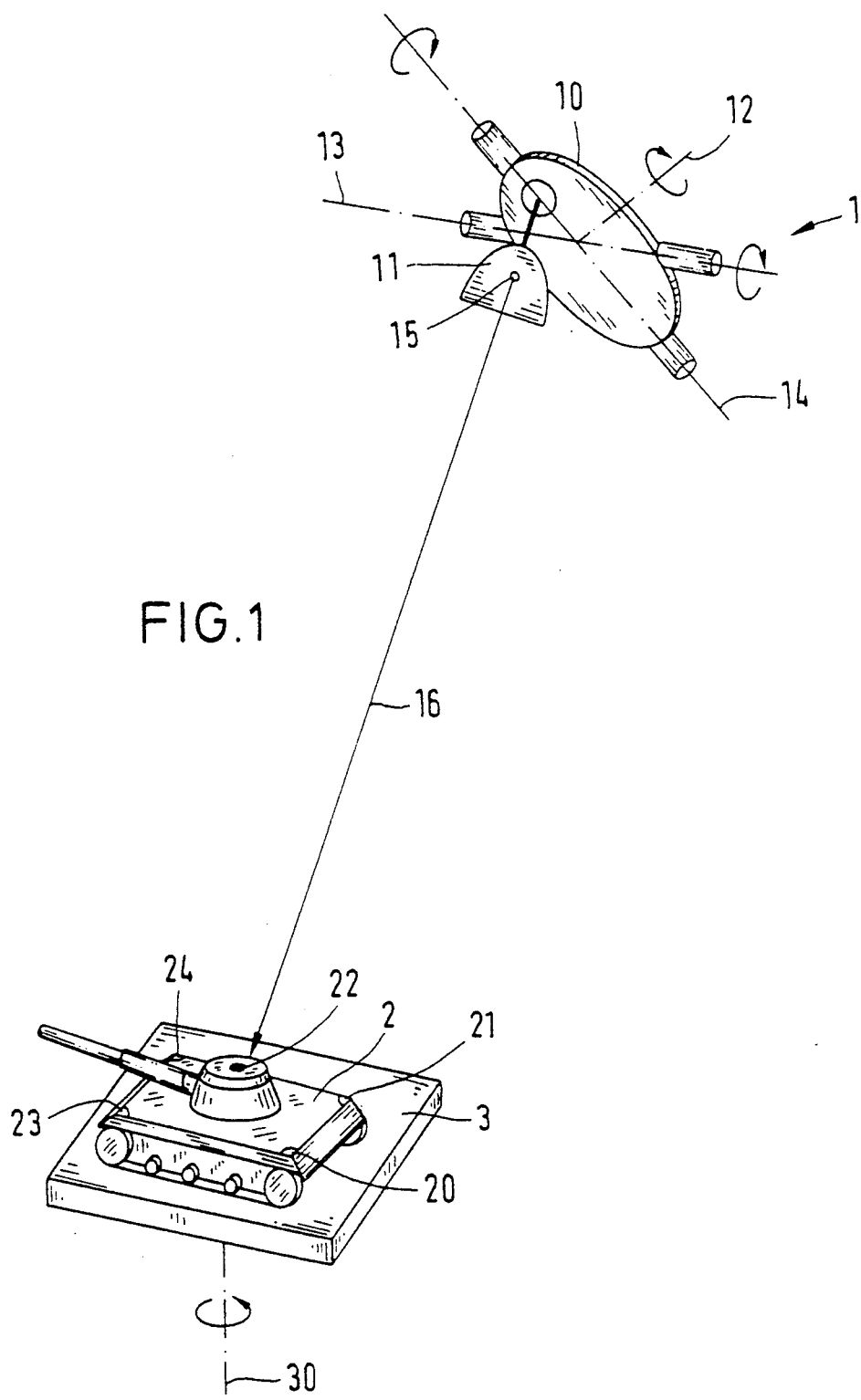
FIG. 1 is a schematic perspective view of an embodiment of the apparatus according to the invention for determining the effective radar backscatter cross section of a tank with the aid of a radar antenna arrangement that simulates the behavior of a flying body approaching the target.

In FIG. 1, there is shown a radar antenna arrangement 1, a radar target 2 (in the present case a tank) whose effective radar backscatter cross section is to be determined, and a revolving platform 3 on which the target 2 is situated. During the determination of the effective radar cross section, this platform 3 rotates about its rotation axis 30 which as illustrated is a vertical axis. Radar antenna arrangement 1 is essentially composed of an antenna platform 10 to which a radar antenna 11 is fastened.

The rotation axis of antenna platform 10 is marked 12 and two pivot axes of the antenna platform, which are perpendicular to the rotation axis 12, are marked 13 and 14 respectively. The phase center (focal point) of antenna 11 is marked 15 and the axis of the main antenna lobe is marked 16. In the illustrated embodiment the antenna platform is mounted on a tower (not shown) so that the antenna platform 10 is above and laterally displaced from the target 2 and the rotating platform 3, with the rotation axis 12 being transverse to the rotation axis 30.

As can be seen in FIG. 1, antenna 11 is disposed outside of the axis of rotation 12 of antenna platform 10. This has the advantage, according to the present invention, that when antenna platform 10 rotates about axis 12, the distance between radar antenna 11 and target 2 changes constantly. This approximately simulates the behavior of the radar arrangement of a flying body approaching the target while it is measuring the backscatter cross section.

The measuring method according to the present invention will now be described in greater detail:

As already mentioned above, the method is based on the concept of replacing the backscatter of the radar target when only part of the target is illuminated and for the case where the radar wavelength is significantly less than the target dimensions with individual scattering centers (local radar cross sections). Five scattering centers, for example, are shown in FIG. 1 and are marked with the reference numerals 20 to 24. In order to arrive at the values for the radar backscatter cross sections of these locally given scatterers, target 2 is scanned in that the inclination of the antenna platform 10 is successively changed by pivoting it about axes 13 and 14, respectively, and for each inclination angle, with the antenna platform 10 rotating about axis 12, the echo data are recorded as a function of the position of the antenna platform 10 and the position of the revolving platform 3. In a practical embodiment, the echo data were measured for four fixed positions (inclination angles) of the antenna platform 10.

The radar device employed in the example of the embodiment of the invention to be described herein in detail was a FMCW type radar having the following specifications:

| | |
|---|---|
| fundamental frequency: | 94 GHz |
| deviation: | 120 MHz |
| rise time: | 400 μs |
| decay time: | 100 μs |
| antenna half-width: | approximately 2° |

However, it is to be understood that other type radar devices, e.g. a pulse Doppler radar device may also be used.

A mathematical description of the echo signal for this FM-CW radar device can be found in Appendix 1.1. The measuring data were picked up from a tower having a height h=100 m; the angle of inclination was about 30°.

It is necessary to known the track of the lobe of antenna 11 on the ground; i.e., the track must be surveyed. The curve for the track in the embodiment was determined with an accuracy of ±0.2 m with the aid of a laser measuring device and/or with the aid of displaceable radar reflectors. For each one of the four positions a table must be compiled which shows the unequivocal relationships between the angle $\gamma$ furnished by an angle sensor of the antenna platform 10 and the antenna lobe track coordinates $x(\gamma)$, $y(\gamma)$ and $z(\gamma)$. It is here sufficient to measure about 8 points per "ellipse". The other points can be calculated therefrom. Pairs of angles each differing by $\pi(180°)$ should be selected for the antenna platform angle $\gamma$.

Figure 2:
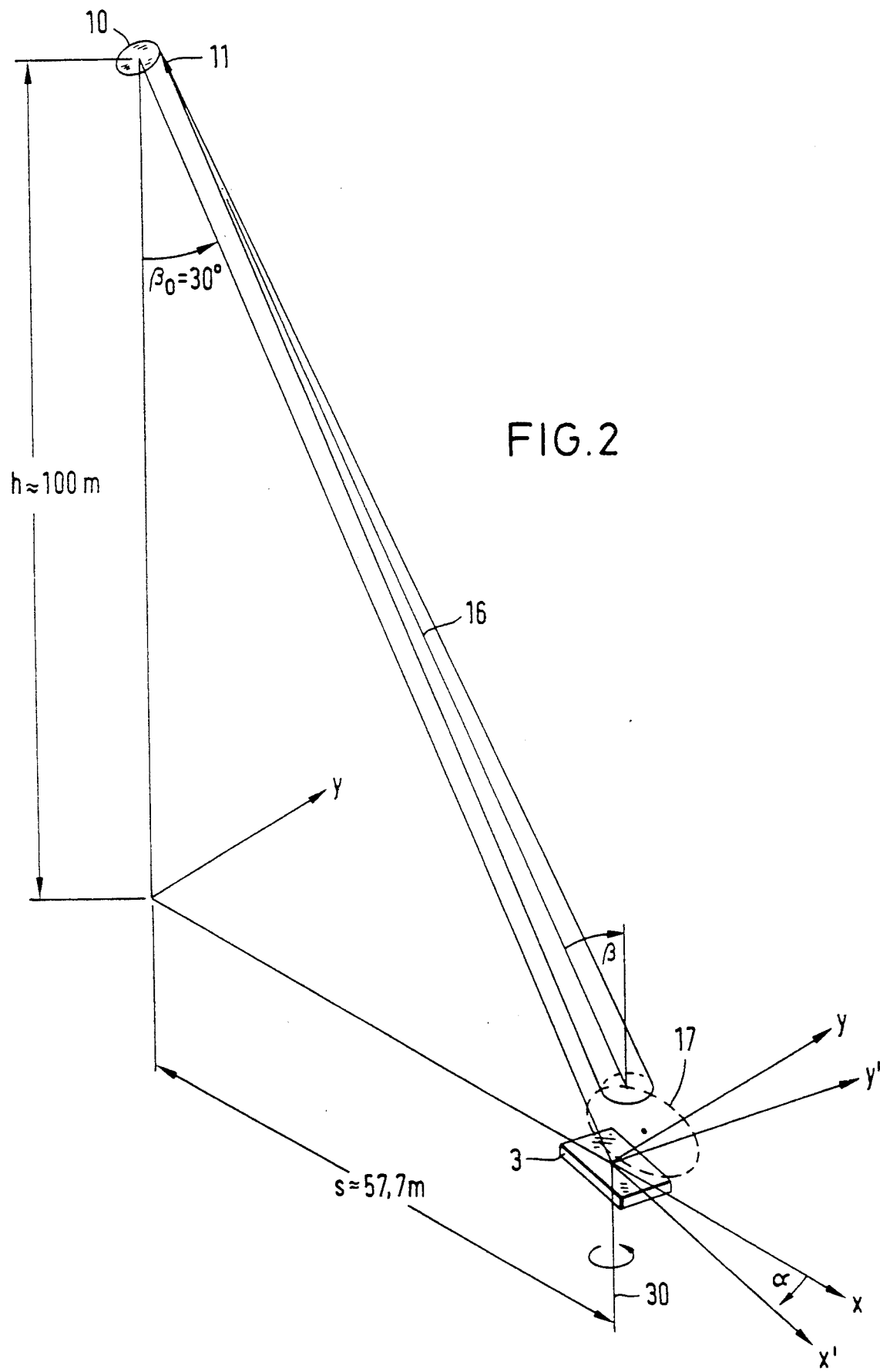
Figure 4:
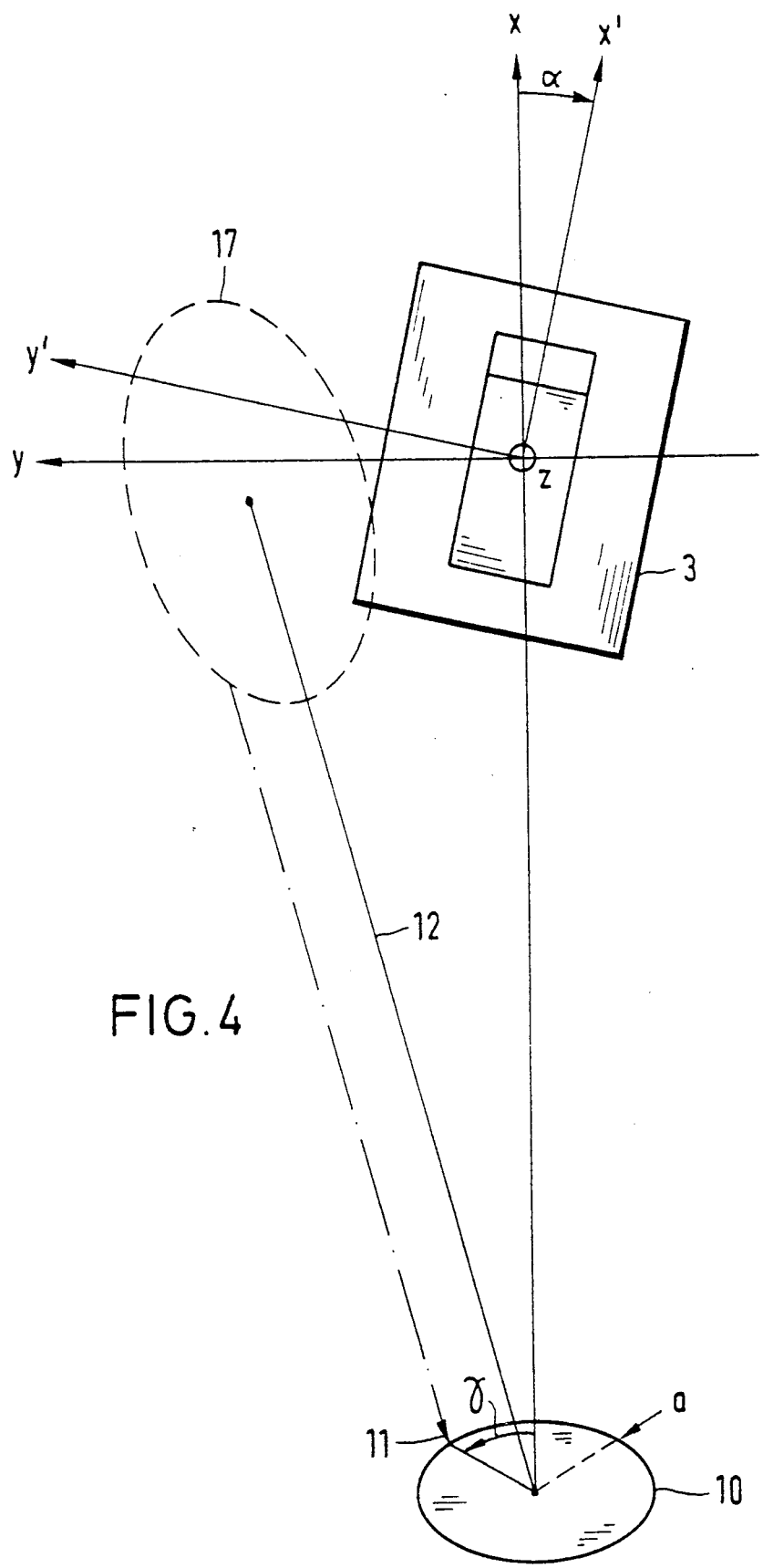
Figure 5:
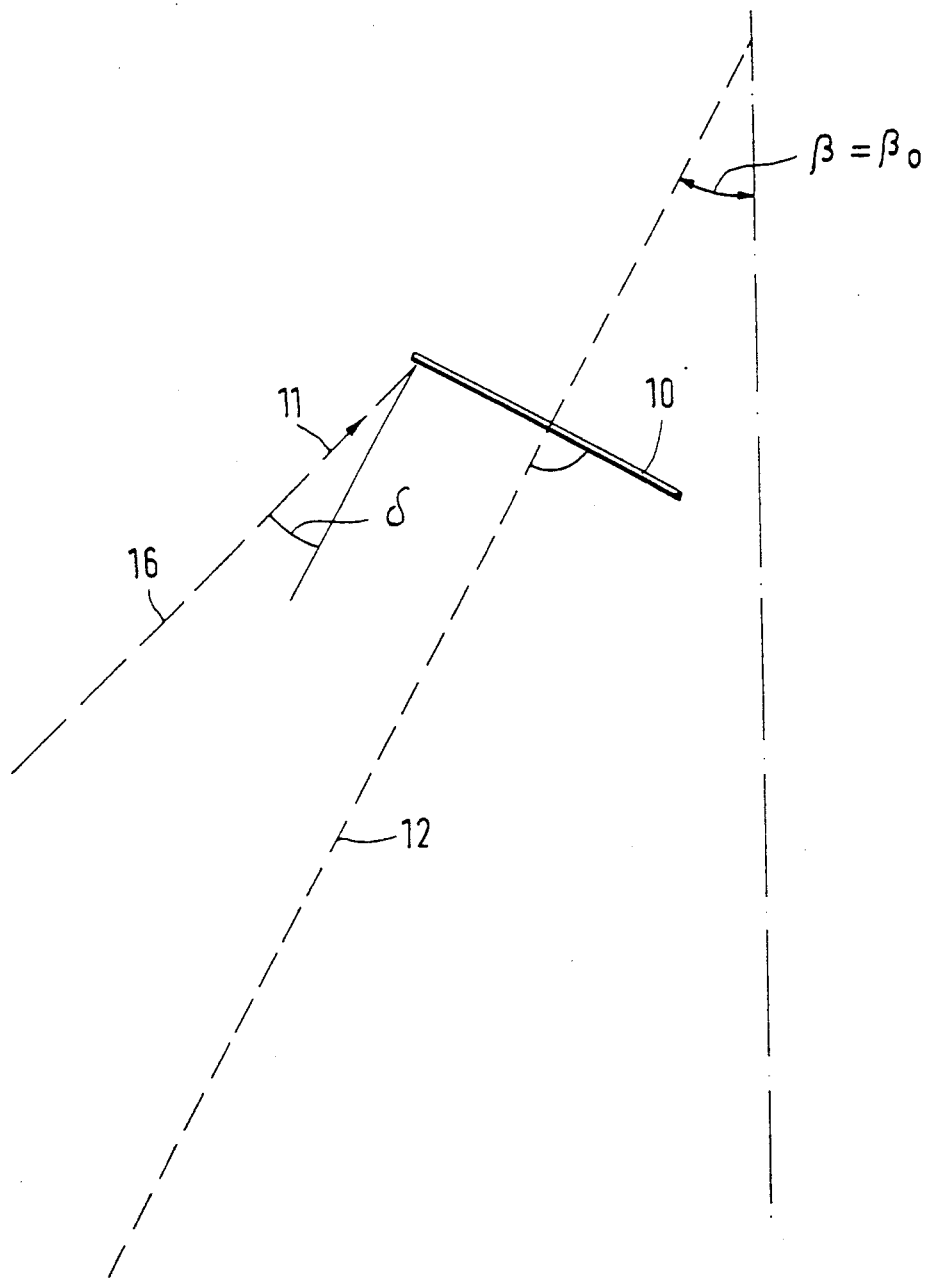

FIG. 2 schematically shows the arrangement for recording of the echo data for a certain inclination of the antenna platform 10. The track of the antenna lobe axis is here marked 17. FIG. 3 is a schematic top view of the measuring arrangement which shows the tracks 17 to 17''' of the antenna lobe for the four various positions of antenna platform 10. FIG. 4 is a corresponding top view of the measuring arrangement for the measuring of track 17 with the revolving platform 3 rotated, while FIG. 5 is a schematic side view of antenna 11 on antenna platform 10, with the inclination angle of the antenna 11 being marked $\delta$.

In each one of the four positions, the echo data are recorded with the antenna platform 10 rotating (platform angle $\gamma$ at $3 \times 360°$/sec). In the illustrated embodiment, the rotation angle $\alpha$ of revolving platform 3 changes at 360°/5 minutes. Five hundred voltage sample values are read out per echo and approximately 666 echoes are measured per revolution of antenna platform 10. For each echo the associated platform angle 7 must be read out.

A block of data is obtained for each one of the four fixed positions of antenna platform 10. Each one of the four data blocks has an associated table giving the track data as shown in the table below.

| Object Angle | Sensor Angle | IF Voltage Values |
|---|---|---|
| $\alpha 0 - \Delta\alpha/2$ | $\gamma 1$ | $u_1(t1), u_1(t2) \ldots u_1(t500)$ |
| ... | ... | ... |
| ... | ... | ... |
| ... | ... | ... |
| ... | ... | ... |
| ... | ... | ... |
| ... | ... | ... |
| $\alpha 0 + \Delta\alpha 2$ | $\gamma N$ | $u_N(t1), u_N(t2) \ldots u_N(t500)$ |

The data block contains a succession of stored echo data. They are each composed of the two angles $\gamma$ (rotation angle of the antenna platform 10) and $\alpha$ (rotation angle of the revolving platform 3) and of 500 real sampling values $u(t_i)$ for the echo voltage. Per revolution of the antenna platform 10, approximately 666 echo values are obtained. During one revolution of the antenna platform 10, the revolving object platform 3 rotates about approximately 0.4 (in the embodiment under discussion). Thus for an aspect angle range of a width of $\Delta\alpha = 3°$, data are obtained from $7.5 \times 666 = 4995$ echoes. If one desires to cover all aspect angle ranges from 0° to 360°, a total of $120 \times 5000 =$ approximately 600,000 echoes must be evaluated. The evaluation of these data and the calculation of the corresponding local radar cross sections for point sources 20 to 24 (FIG. 1) is effected with the aid of a four-dimensional image function and a subsequent inverse convolution algorithm.

Calculation of the Four-Dimensional Image Function

For each block of raw data, that is, for each fixed position of the antenna platform 10, there belongs a specific change in orientation $u_i$ (unit vector) of the antenna lobe for platform angle $\gamma$. This change can be described by the following equation:

$$\vec{u_i}(\gamma) = \vec{c} + \vec{a}\cos(\gamma) + \vec{b}\sin(\gamma)$$

where $\vec{a}$, $\vec{b}$ and $\vec{c}$ are mutually orthogonal vectors.

These vectors can be determined from points $\vec{r}(\gamma k)$ through which passes the axis of the radiation lobe at $\gamma = \gamma k$. Measuring point $\gamma k$ must here also include the measuring point $\gamma k + 180°$.

Each echo signal is represented by the angles $\gamma$ and $\alpha$ and the 500 real value sample values $u_1$ to $u_{500}$. To perform a 512 point FFT (FFT=fast Fourier transform), the last 12 positions are occupied with zeroes. For a 1024 point FFT, 524 zeroes are read in correspondingly behind the measured data.

The result of the FFT is obtained in the form of 512 and 1024, respectively, complex numbers $U_m$. The $m^{th}$ number $U_m$ belongs to a distance gate for the distance $$R_m = m \cdot \delta R$$

The distance increment here results as follows:

$$\delta R = \frac{c \cdot T}{2} \cdot \frac{\delta f}{\Delta f}$$

and

-continued $$\delta f = \frac{1}{NFFT \cdot \delta t}$$

where c=speed of light; Δf=frequency deviation; T=rise time; and δt=sampling rate.

With the radar system employed the following applies: Δf=120 MHz, T=400 μs, and δt=0.8 μs, so that the distance increment δR [m]=625/NFFT (NFFT: number of fast Fourier transform locations).

Thus the center of the resolution cell belonging to angle γ and to the number m of the distance gate is given as follows:

$$\vec{r}_M = s\vec{u}_x + h\vec{u}_z + m\delta R \cdot \vec{u}_i(\delta) \qquad (5)$$

where s=distance of the revolving platform 3 from the tower h=height of the tower=height of the antenna platform 10, (In the illustrative specific example: s [m]=57.7; and h [m]=100).

For a definition of the term "resolution cell" in conjunction with the discrete Fourier transform see Appendix 1.2.

Consequently, the cartesian components of $\vec{r}_M$ are the following:

$$x_M = -s + m \cdot \delta R \ (c_x + a_x \cos(\gamma) - b_x \sin(\gamma))$$

$$y_M = m \cdot \delta R \ (c_y - a_y \cos(\delta) - b_z \sin(\gamma))$$

$$z_M = h + m \cdot \delta R \ (c_z + a_z \cos(\gamma) + b_z \sin(\gamma))$$

where $a_x, a_y, a_z, b_x, \ldots$ are the cartesian components of the vectors $\vec{a}, \vec{b}, \vec{c}$.

Since only some of the distance gates (m=1 to 512) belong to distances that correspond to the distance of the object, only the gates having the numbers $m_{min}$ to $m_{min}+9$ are read out.

If one plots for a fixed aspect angle α the value $|U_m|^2$ ($m^{th}$ value of the discrete spectrum of the IF signal) as a function of $\vec{r}_M$, one obtains the real value image function $$\vec{F}(\alpha, \vec{r}_m).$$

Since $\vec{F}$ is a function of α and of the three coordinates of $\vec{r}_M$, it is called a four-dimensional image function.

Figure 6:
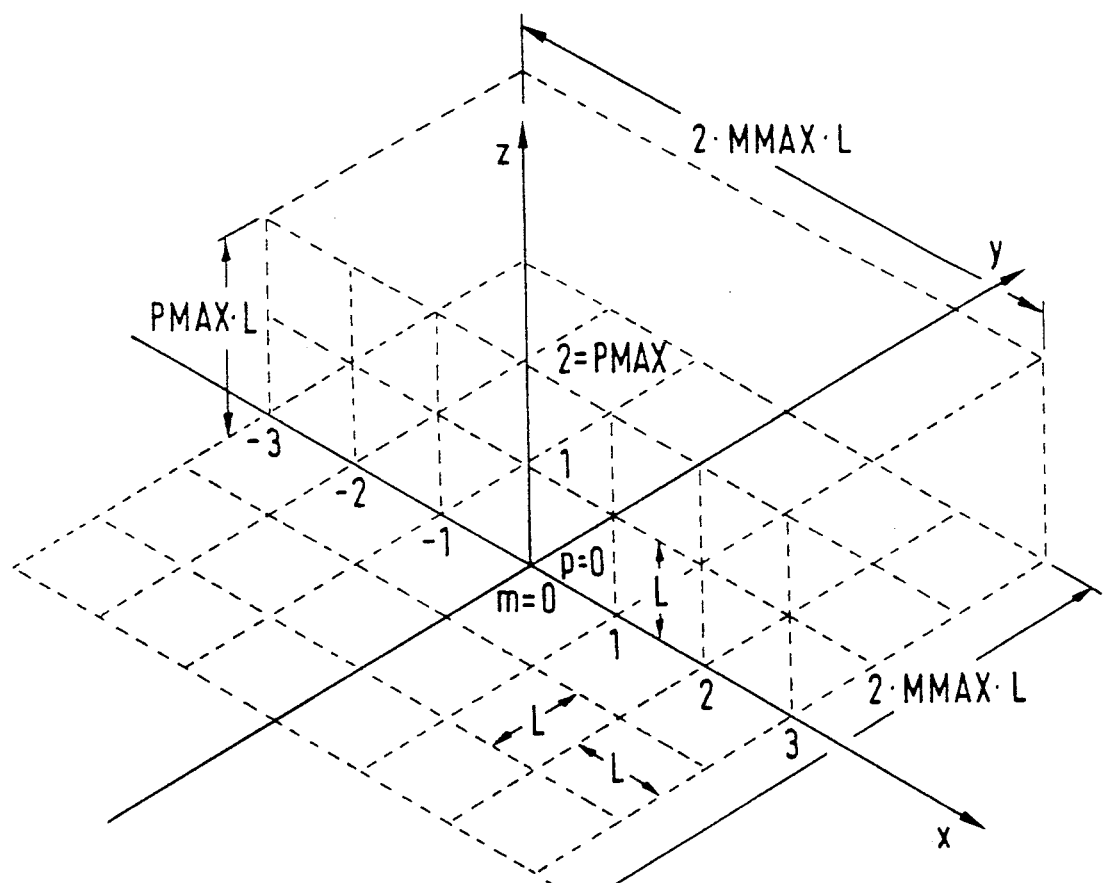

An algorithm will now be described with which a discrete averaged image function $$F(\alpha_\mu, \vec{r}_M)$$

can be calculated for the following aspect angle ranges:

$$\alpha_\mu - \frac{\Delta\alpha}{2} \leq \alpha \leq \alpha_\mu + \frac{\Delta\alpha}{2}$$

where Δα=3°. To accomplish this, a three-dimensional grid is defined as shown in FIG. 6 with a grid width L (in [m])

The grid points are given by $$\vec{r}_{m,n,p} = L \ [m \cdot \vec{u}_x + n \cdot \vec{u}_y + p \cdot \vec{u}_z]$$

where L=grid width; m, n, p=integers, with the integers m and n extending from −MMAX to +MMAX and the integer p from 0 to PMAX.

There thus are a total of $(2 \cdot MMAX+1)^2 \cdot (PMAX+1)$ grid points. (Maximum value: MMAX≦6, PMAX≦3).

Thus there are at most $13^2 \cdot 4 = 676$ grid points for each one of the 60 aspect angle ranges.

A measured value is associated with that grid point which lies closest to the respective center of the resolution cell. If in the course of the procedure this angle is hit again (possibly repeatedly) in the same aspect angle range, an average value $\overline{F}_{m,n,p}$ and a variance value $S_{m,n,p}$ are formed as follows:

$$\overline{F}(m,n,p) = \frac{1}{I} \sum_{i=1}^{I} (F_i(m,n,p))$$

and $$S(m,n,p) = \frac{1}{I} \sum_{i=1}^{I} (F_i(m,n,p) - \overline{F}(m,n,p))^2$$

To form these expressions, the respective last values of $\overline{F}$ and S as well as I must be stored (see Appendix 2).

The grid point (m,n,p) belonging to the coordinates $(x_M, y_M, z_M)$ of the center of the resolution cell is calculated by rounding up or down the following coordinates which are standardized to L:

m=shortest distance integer of $\{x_M/L\}$
n=shortest distance integer of $\{y_M/L\}$
p=shortest distance integer of $\{z_M/L\}$ ($x_M, y_M, z_M$ are cartesian components of vector $\vec{r}_M$.)

If the amount of |m| or |n| exceeds the given value MMAX, the measured value is not associated with a grid point. The same applies if p either becomes negative or greater than PMAX.

Figure 7:
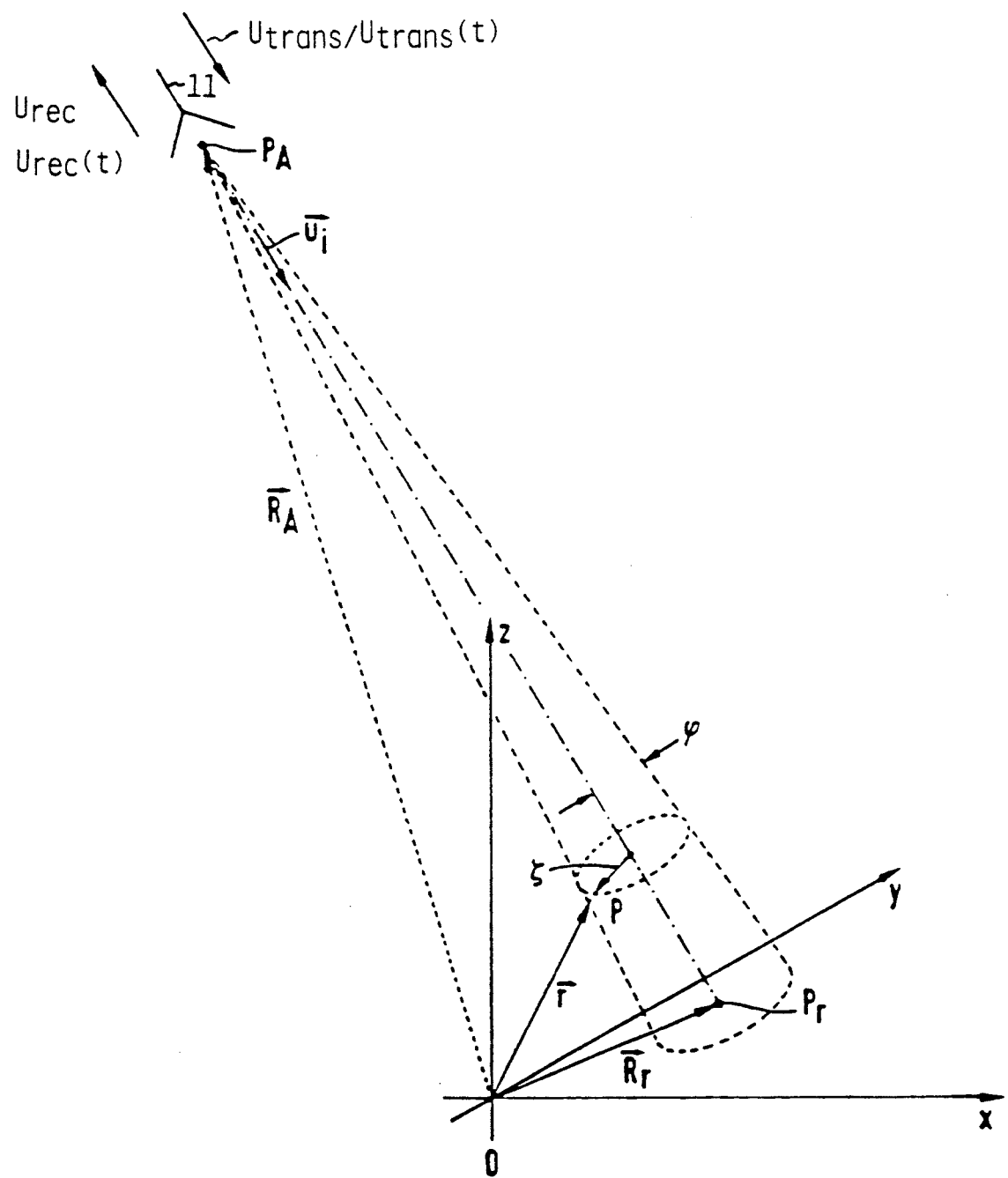
FIGS. 7-9 are schematic representations used to explain details of method according to the present invention.

Inverse Convolution Algorithm (see also FIG. 7)

The image function $F_j=f(m,n,p)$ calculated for each points $\vec{r}_j = \vec{r}_m(j), n(j), p(j)$ results by convolution of the spatial distribution of the radar cross section $\sigma(\vec{r})$ with the weighting function $w(\vec{r}-\vec{r}_j)$. The weighting function is here formed as the product of a (transversal) function which approximates the directional characteristic of the antenna $$w_{tr}^2 [\xi(\vec{r} - \vec{r}_j)] = \exp\left[-2\left(\frac{\xi}{\xi_0}\right)^2\right] \qquad (1)$$

wherein $\xi_0$=2.5 m and the longitudinal weighting function which approximates the characteristic of the distance gate $$w_l^2 [\zeta(\vec{r} - \vec{r}_j)] = \exp\left[-2\left(\frac{\zeta}{\zeta_0}\right)^2\right] \qquad (2)$$

where $\zeta_0$=0.92 m:

$$w^2 = w_l^2 \cdot w_{tr}^2$$

ζ is the longitudinal distance of the point vector $\vec{r}$ from the center of the resolution cell $\vec{r}_j$ and is calculated as follows:

$$\zeta(\vec{r} - \vec{r}_j) = |(\vec{r} - \vec{r}_j) \cdot \vec{u}_i|$$

If

-continued $$\vec{u}_t \approx \frac{1}{2}(\vec{u}_x - \sqrt{3}\,\vec{u}_z) \qquad (3)$$

it follows that $$\zeta = \left| \frac{1}{2}(x - x_j) - \frac{\sqrt{3}}{2}(z - z_j) \right| \qquad (4)$$

The transversal distance $\xi$ is calculated as follows:

$$\xi = \sqrt{(x - x_j)^2 + (y - y_j)^2 + (z - z_j)^2 - \zeta^2} \qquad (5)$$

The spatial distribution of the radar cross section may be assumed to be in the form of I point sources having the radar cross sections $\sigma_i$ (i=1, ..., I). The coordinates $x_i'$, $y_i'$, $z_i'$ of these point sources in the coordinate system that is fixed to the object platform can be given as desired. However, if possible, they should be placed into the vicinity of locations occupied by scattering centers.

For given angles, the point source coordinates can be recalculated as follows from the coordinate system $x_i'$, $Y_i'$, $z_i'$ that is fixed to the object platform and the coordinate system $x_i$, $Y_i$, $z_i$ that is fixed in space:

$$x_i = x_i' \cos(\alpha) - y_i' \sin(\alpha)$$

$$y_i = -x_i' \sin(\alpha) - y_i' \cos(\alpha) \qquad (6)$$

$$z_i = z_i'$$

The convolution in the discrete form then results correspondingly as follows:

$$F_j = \sum_{i=1}^{I} A_{ji}\, \sigma_i \quad j = 1, \ldots, J \qquad (7)$$

where $$A_{ji} = w_1^2\,[\zeta(\vec{r}_i - \vec{r}_j)]\, w_{tr}^2\,[\xi(\vec{r}_i - \vec{r}_j)] \qquad (8)$$

Since the number J of grid points for which the image function was calculated will be higher than the number I of point sources, Equation (7) represents an overdefined equation system. The solution leading to the smallest quadratic error can here be selected for $\sigma_i$.

$$\sum_{j=1}^{J} |\tilde{F}_j - F_j|^2$$

An analogous inverse convolution is performed for the variance.

To standardize the thus obtained "statistical" backscatter cross sections, it is necessary to perform a calibration measurement (see in this connection Appendix 3).

Required Hardware

Figure 10:
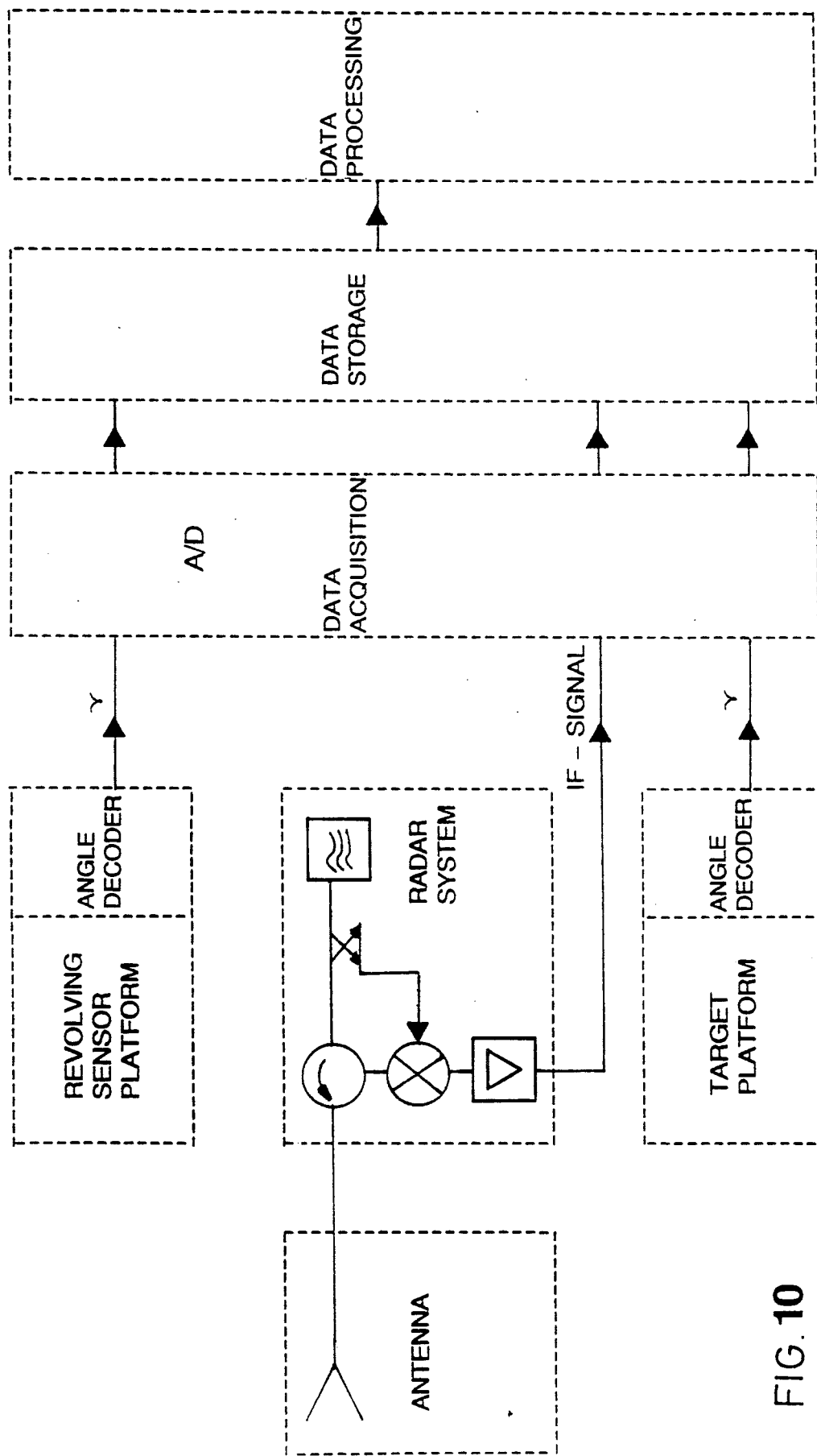
FIG. 10 schematically shows the complete system, including antenna, radar system, angle measurement devices, sensor and target platforms, a well as data acquisition, data storage and data processing units.

FIG. 10 summarizes the hardwarem, needed to obtain the parameters of the model.

The antenna 11 is mounted according to FIG. 1 on the revolving sensor platform 10. The time dependent angle $\gamma$ of rotation of the platform 10 is measured by means of the angle decoder. The radar system (FM-CW or pulse radar) provides the trasmitted signal to be fed into the antenna and partially the analog signal processing of the received echo signal. The receiver part of the radar system performs the frequency conversation (mixing) to the intermediate frequency (IF) and IF amplification.

The IF signal is converted to a digital signal by both time and amplitude discretization (data acquisition). These digital signals are stored, together with the corresponding values of the revolving angle $\gamma$ of the sensor platform 11 and the revolving angle $\gamma$ of the target platform 3 in FIG. 1, in a digital decoder. In the data processing system (e.g., a PC) the FFt, calculation of the image function and the deconvalution are performed.

APPENDIX 1.1

Echo Signal From A FM-CW Radar Probe

This section will demonstrate the relationship between the echo signal data in the LF portion of the FM-CW radar and the spatial distribution of the radar cross section for any desired antenna position and orientation.

For this purpose, it is initially necessary to introduce an unequivocal description of the antenna position and orientation by means of the so-called "antenna parameters". According to FIG. 7, the zero point 0 of the coordinate system is disposed in the center of rotation of the object or target platform 3. The phase center of the antenna 11 at point $P_A$ is described by the following locus vector:

$$\vec{R}_A = x_A \vec{u}_x + y_A \vec{u}_y + z_A \vec{u}_z$$

where $\vec{u}_x$, $\vec{u}_y$ and $\vec{u}_z$ are the unit vectors in the x, y and z directions respectively; and $X_A$, $Y_A$, $Z_A$ are cartesian coordinates.

The axis $\Gamma$ of the rotationally symmetrical antenna lobe is assumed to be oriented in the direction of unit vector $\vec{u}_1$ (see FIG. 7).

If one knows any point $P_\Gamma$ (except for $P_A$) on axis $\Gamma$, $\vec{u}_i$ can be calculated as follows:

$$\vec{u}_i = \frac{\vec{R}_\Gamma - \vec{R}_A}{|\vec{R}_\Gamma - \vec{R}_A|} \qquad (1.1.1)$$

If one feeds the active power $P^{(S)}$ into the antenna, the associated electromagnetic field E in the range of $$|\vec{r} - \vec{R}_a| > \frac{2 D_A^2}{\lambda_0} \qquad (1.1.2)$$

(far field condition for antenna field, $D_A$=antenna diameter) results as follows:

$$E(r) = \frac{\exp\left(-j2\pi \frac{|\vec{r} - \vec{R}_A|}{\lambda_0}\right)}{|\vec{r} - \vec{R}_A|} \sqrt{\frac{Z_0}{2\pi}}\, C(\phi) \cdot \sqrt{P^{(S)}}\, \vec{e} \qquad (1.1.3)$$

where $Z_0 \approx 377\,\Omega$.

The unity vector $\vec{e}$ which is perpendicular to $(\vec{r} - \vec{E}_A)$ here characterizes the polarization and $C(\phi)$ is the absolute directional characteristic. $C(\phi)$ is defined in such a way that its squared amount is equal to the gain function G as follows:

$$\tilde{G}(\phi) = C^2(\phi) \qquad (1.1.4)$$

Thus, $C^2(0)$ is equal to the gain G of the antenna.

In order to express the angle $\phi$ in Equation (1.1.4) by the point vector $\vec{r}$, the distance $\zeta$ of point vector $\vec{r}$ from axis $\Gamma$ is initially determined (see FIG. 7). The following results:

$$\zeta = |(\vec{r} - \vec{R}_A) - [(\vec{r} - \vec{R}_A) \cdot \vec{u}_\Gamma] \vec{u}_\Gamma| \qquad (1.1.5)$$

and from it:

$$\phi(\vec{r}) = \arcsin\left(\frac{\zeta}{|\vec{r} - \vec{R}_A|}\right) \qquad (1.1.6)$$

If a point source having a radar cross section $\sigma$, for the given polarization characterized by $\vec{e}$, and a scattering phase $\psi$ is present at locus $\vec{r}_0$, the received voltage $U_{rec}$ results as follows at the antenna gate as a function of the transmitted voltage $U_{transm}$ at the same gate:

$$U_{rec} = \frac{\lambda_0 e^{-j\frac{4\pi}{\lambda_0}|\vec{R}_A - \vec{r}_0| - \psi}}{(4\pi)^{3/2}\sqrt{L_C}\,|\vec{R}_A - \vec{r}_0|^2} C^2(\phi)\sqrt{\sigma}\, U_{transm} \qquad (1.1.7)$$

where $L_C$ is the loss factor.

With N different sources having a radar cross section $\sigma_n$ and phases $\psi_n$, one thus obtains the following:

$$\frac{U_{rec}}{U_{transm}} = \qquad (1.1.8)$$

$$\frac{\lambda_0}{(4\pi)^{3/2}\sqrt{L_C}} \sum_{n=1}^{N} \frac{e^{-j\frac{4\pi}{\lambda_0}|\vec{R}_A - \vec{r}_n|}}{|\vec{R}_A - \vec{r}_n|^2} C^2(\phi_n) e^{-j\psi_n} \sqrt{\sigma_n}$$

With the aid of the previous results, the echo signal for a FM-CW radar is now derived.

Figure 8:
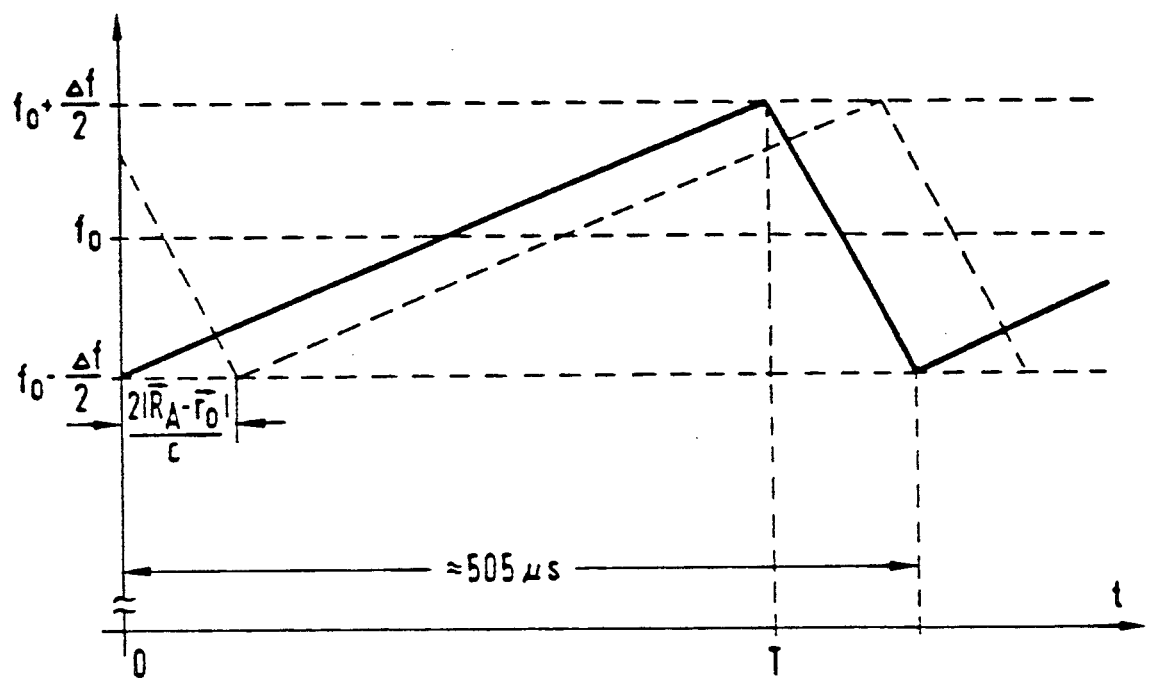

The transmitted signal at the antenna input is assumed to be given as follows:

$$u_{transm}(t) = \hat{u}\cos[\Phi(t)]$$

and the momentary frequency $v(t)$ is assumed to have a curve according to FIG. 8.

$$v(t) = \frac{1}{2\pi}\frac{d\Phi}{dt} = f_0 - \left(t - \frac{T}{2}\right)\frac{\Delta f}{T}$$

for $0 < t < T$ where
$\Delta f$ is the frequency deviation
$f_0$ is the fundamental frequency
T is the rise time Consequently:

$$u_{transm}(t) = \qquad (1.1.9)$$

$$\hat{u}\cos\left[2\pi f_0\left(t - \frac{T}{2}\right) + \pi\frac{\Delta f}{T}\left(t - \frac{T}{2}\right)^2 + \Phi_0\right]$$

According to Equation (1.1.8), the associated echo signal for a point source at point $\vec{r}_0$ is obtained as follows:

$$u_{rec}(t) = \qquad (1.1.10)$$

$$\frac{\lambda_0 C^2(\phi)\sqrt{\sigma}\,\hat{u}}{(4\pi)^{3/2}\sqrt{L_C}\,|\vec{R}_A - \vec{r}_0|^2}\cos\left[2\pi f_0\left(t - \frac{2|\vec{R}_A - \vec{r}_0|}{c} - \frac{T}{2}\right) - \pi\frac{\Delta f}{T}\left(t - \frac{2|\vec{R}_A - \vec{r}_0|}{c} - \frac{T}{2}\right)^2 + \Phi_0 - \psi_0\right]$$

The echo signal is fed to a mixer at whose LO (local oscillator) input there is a voltage $u_{LO}(t)$ which differs from $u_{transm}(t)$ only with respect to its amplitude and its possible phase, as follows:

$$u_{LO}(t) = \hat{u}_{LO}\cos\left[2\pi f_0\left(t - \frac{T}{2}\right) + \pi\frac{\Delta f}{T}\left(t - \frac{T}{2}\right)^2 + \Phi_i\right]$$

The following applies for the LF output voltage:

$$\tilde{u}(t) = LF\text{ component }\{K_1\, u_{LO}(t)\, u_{rec}(t)\}$$

where $K_1$ is a characteristic of the mixer of a dimension 1/V. Consequently:

$$\tilde{u}(t) = \qquad (1.1.11)$$

$$\frac{K_1\lambda_0\hat{u}\hat{u}_{LO}}{2(4\pi)^{3/2}\sqrt{L_C}}\frac{C^2(\phi(\vec{r}_0))}{|\vec{R}_A - \vec{r}_0|^2}\sqrt{\sigma}\cos\left[4\pi\frac{\Delta f}{cT}|\vec{R}_A - \vec{r}_0|\left(t - \frac{T}{2}\right) + 4\pi\frac{f_0}{c}|\vec{R}_A - \vec{r}_0| + \frac{4\pi\Delta f}{Tc^2}|\vec{R}_A - \vec{r}_0|^2 + (\Phi_0 - \Phi_i) - \psi_0\right]$$

The last equation (1.1.11) can be simplified if:
(1) a filter $H_1(f)$ is incorporated in the LF branch so as to effect a compensation for the distance dependent drop in amplitude:

$$U(f) = H_1(f)\tilde{U}(f) = K_2\left|\frac{f}{f_{max}}\right|^2 \tilde{u}(f)$$

where $f_{max} = 2\frac{\Delta f}{cT}R_{max}$, so that the following applies for the individual point source:

$$u(t) = K_2\frac{|\vec{R}_A - \vec{r}_0|^2}{R_{max}^2}\tilde{u}(t)$$

where $R_{max}$ is an arbitrarily selected reference distance.
(2) the first factor which is independent of the radar target and the antenna position and orientation is abbreviated as follows:

$$K = \frac{K_1 K_2 \lambda_0 \hat{u}\hat{u}_{LO}}{2(4\pi)^{3/2}\sqrt{L_C}\,R_{max}^2}\,\cdot\,[K_2] = \frac{V}{m};$$

(3) the phase term $$\frac{4\pi \Delta f}{Tc^2} |\vec{R}_A - \vec{r}_0|^2$$

is neglected relative to the other terms; and
(4) $\Phi_0 - \Phi_1 = \bar{\Phi}$ is set.

The following then remains:

$$u(t) = K_2 C^2(\phi) \sqrt{\sigma} \cos\left[4\pi \frac{\Delta f}{cT} |\vec{R}_A - \vec{r}_0| \left(t - \frac{T}{2}\right) + 4\pi \frac{f_0}{c} |\vec{R}_A - \vec{r}_0| - \bar{\Phi} - \upsilon\right]$$

If one now again considers several point sources and permits Doppler shifts for them, the following results for the LF signal:

$$u(t) = K \sum_{n=1}^{N} C^2(\phi(\vec{r}_n)) \sqrt{\sigma_n} \cos\left[2\pi \left(\frac{2\Delta f}{cT} |\vec{R}_A - \vec{r}_n| - f_{d,n}\right)\left(t - \frac{T}{2}\right) - 4\pi \frac{f_0}{c} |\vec{R}_A - \vec{r}_n| - \bar{\Phi} - \upsilon_n\right] \text{ where } \frac{2 |\vec{R}_A - \vec{r}_n|_{max}}{c} < t < T$$ (1.1.12)

The function $\phi(\vec{r}_n)$ should be selected according to Equation (1.1.6).

From Equation (1.1.12) and the following Doppler shift relationship:

$$f_{d,n} = \frac{2}{c} v_{r,n} \cdot f_0 \cdot v_{r,n} = \frac{d}{dt} |\vec{R}_A - \vec{r}_n|$$ (1.1.13)

it is evident that a point source at a distance $$\rho_n^{def} = |\vec{R}_A - \vec{r}_n|$$

and travelling a radial velocity of $$v_{r,n} = \frac{d\rho_n}{dt}$$

results in the following LF frequency (beat frequency):

$$f_{p,n} = \frac{2\rho_n}{c} \cdot \frac{\Delta f}{T} - \frac{2}{c} v_{r,n} \cdot f_0$$ (1.1.14)

In the present example, the following numerical value equation applies for $\Delta f = 120$ MHz, $T = 400$ $\mu$s and $f_0 = 94$ GHz:

$$\frac{f_{p,n}}{\text{kHz}} = 2 \cdot \frac{\rho_n}{m} - 0.626 \frac{v_{r,n}}{m/s}$$ (1.1.15)

The voltage u(t) is sampled with a time increment of, for example, $\delta t = 0.8$ $\mu$s and then furnishes 500 (time domain) sampling values as follows:

$$u_\mu^{def} = u(t = \mu \delta t) \text{ where } \mu = 0 \text{ to } 499$$ (1.1.16)

APPENDIX 1.2
The Discrete Fourier Transformation of The echo Signal: Definition and Approximation of the Resolution Cell The discrete Fourier transform (DFT) of the order of M of the sampled values $u_\mu$ for the voltage is defined by way of the following:

$$U_\nu = \sum_{\mu=0}^{M-1} u_\mu \exp\left(-j\frac{2\pi}{M}\right)^{\nu \cdot \mu}$$ (1.2.1)

With $M = 2^Q$, the DFT can be calculated by way of an FFT [fast Fourier transform]. In the present case $M = 512$ or 1024 is applicable. For this purpose, the 500 sampled values are filled with zeroes to reach 512 or 1024 values. Moreover, in order to reduce the aliasing effect, a window function (filtering) may be employed. The following then applies:

$$\tilde{u}_\mu = g_\mu \cdot u_\mu$$ (1.2.2)

where $$g_\mu = \sin^2\left(\frac{\mu}{M_0} \cdot \frac{\pi}{2}\right) \text{ for } \mu = 0 \text{ to } M_0$$

$$g_\mu = 1 \text{ for } \mu = M_0 - 1 \text{ to } 499 - M_0$$

$$g_\mu = \sin^2\left(\frac{\mu - 499}{M_0} \cdot \frac{\pi}{2}\right) \text{ for } \mu = (499 - M_0) \text{ to } 499$$

and $$g_\mu = 0 \text{ for } \mu = 500 \text{ to } M - 1.$$

$M_0$ is here a predetermined number which should advisably be selected within a range from $M_0 = 0$ to 20.

The result of the DFT for the signal according to Equation (1.1.12) can now be derived as follows:

For this purpose, the following "time gate function[ is initially introduced as an auxiliary function:

$$w(\xi)^{def} = \sum_{\mu=0}^{M-1} g_\mu \exp\left(-j2\pi \frac{\xi}{\delta_\rho} \cdot \frac{\mu}{M}\right)$$ (1.2.3)

Here the distance increment, $\delta_\rho$ is given by $$\delta_\rho = \frac{cT}{2\Delta f \cdot \delta t \cdot M}$$ (1.2.4)

Thus, with the system parameters of $T = 400$ $\mu$s, $\Delta f = 120$ MHz and $\delta t = 0.8$ $\mu$s, the following results:

$$\frac{\delta_p}{m} = \frac{625}{M} \tag{1.2.5}$$

Therefore, for $M=512$ and 1024, the distance increment $\delta_p$ is 1.22 m and 0.67 m, respectively.

The time gate function can be calculated as follows under the assumption that $M_0=0$ ("no filtering with window function") and under consideration of the given numerical values:

$$w_l(\xi) = \exp\left[-j2.5\frac{\xi}{m}\right] si\left[2.51 \cdot \frac{\xi}{m}\right] \tag{1.2.6}$$

$w_l(\xi)$ is thus independent of the selection of the value M of the FFT. Inserting Equation (1.1.12) into Equation (1.2.1) results in the following:

$$U_\nu = \frac{K}{2}\sum_{n=1}^{N} C^2(\phi(\vec{r_n}))\sqrt{\sigma_n}\, e^{-j\Phi_n}w_1\left[|\vec{R}_A - \vec{r_n}| - v_{r,n}T\frac{f_0}{\Delta f} - \nu\delta_p\right] -$$

$$\frac{K}{2}\sum_{n=1}^{N} C^2(\phi(\vec{r_n}))\sqrt{\sigma_n}\, e^{-j\Phi_n}w_1\left[|\vec{R}_A - \vec{r_n}| - v_{r,n}T\frac{f_0}{\Delta f} - \nu\delta_p\right] \tag{1.2.7}$$

with the phase $\Phi_n$ being calculated from the phases $\Phi_n$ and the distance caused phases $4\pi f_0|\vec{R}_A - \vec{r_n}|/c$.

A radial velocity $v_{r,n}$ of the $n^{th}$ target point has the same effect with respect to signal $U_\nu$ as a shift in the distance $|\vec{R}_A = \vec{r_n}|$ by $$\frac{\Delta}{m} = 0.313\frac{v_{r,n}}{m/s}$$

In the calculation of $U_\nu$ for "high" positive values of n, the second term of Equation (1.2.7) can be neglected. If it is additionally possible to neglect the Doppler shift, the following remains:

$$U_\nu \approx \frac{K}{2}\sum_{n=1}^{N} C^2(\phi(\vec{r_n}))w_1[|\vec{R}_A - \vec{r_n}| - \nu\delta_p]\sqrt{\sigma_n}\, e^{-j\Phi_n} \tag{1.2.8}$$

$$= \sum_{n=1}^{N} w(\vec{r_n})\sqrt{\sigma_n}\, e^{-j\Phi_n}$$

Equation (1.2.8) shows that $U_\nu$ is the weighted sum of all complex valued scatter contributions $\sqrt{\sigma_n}\exp(-j\Phi_n)$. The weighting function $w(\vec{r_n})$ results as follows:

$$w(\vec{r_n}) = \frac{K}{2} w_1[|\vec{R}_A - \vec{r_n}| - \nu\delta_p]C^2(\phi(\vec{r_n})) \tag{1.2.9}$$

and thus results from the time gate function $w_1$ and the gain function $C^2$ of the antenna.

Figure 9:
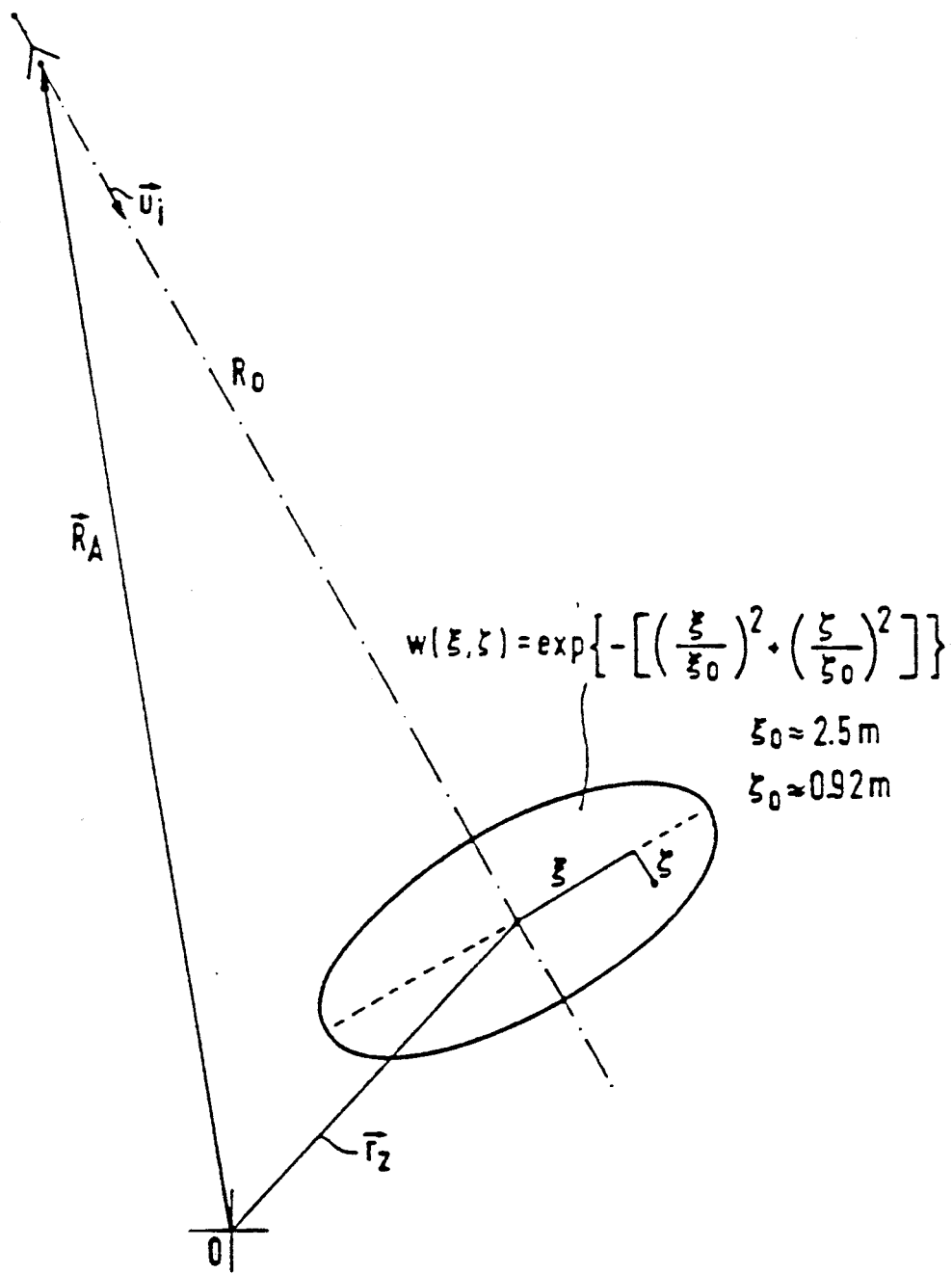

$w(\vec{r})$ has its maximum at $|\vec{R}_A - \vec{r_n}| = \nu\delta_p$ and $\phi=0$, that is at the following point (see FIG. 9):

$$\vec{r} = \vec{R}_A + \vec{u_l} \cdot \nu\delta_{92} \tag{1.2.10}$$

This point, which is a function of the orientation $u_l$ of the antenna lobe and the number $\nu$ of the distance gate, is called the center of the resolution cell.

With the aid of a calibration measurement (see Appendix 3) and suitable standardization of voltage $U_\nu$ it is possible to attain the following:

$$w(\vec{r_z}) = 1 \tag{1.2.11}$$

Under consideration of the fact that the function $w(\vec{r})$ is negligibly small for points that are more than 4 m away $\vec{r_z}$, the longitudinal distance $$\zeta_n = \vec{u_l}(\vec{r_n} - \vec{r_z})$$

can be approximated for $|\vec{R}_A - \vec{r_n}| - \nu\delta_p$. Thus the longitudinal weighting function becomes the following:

$$w_1 \approx si\left[2.51 \cdot \frac{\zeta_n}{m}\right]$$

For arguments less than x, this si function can be approximated by means of the following Gauss function:

$$w_1 \approx \exp\left[-\left(\frac{\zeta}{\zeta_0}\right)^2\right] \tag{1.2.12}$$

where $\zeta_0 \approx 0.92$ m.

The transversal weighting function derived from the gain function can be expressed as follows with the aid of the transversal distance (see also Equation 1.1.5).

$$\xi = \sqrt{|\vec{r} - \vec{r_z}|^2 - \zeta^2}$$

$$w_{tr}(\xi) = \frac{K}{2} C^2(\phi(\vec{r}))$$

If one also approximates this function by a Gauss function, the following results under consideration of an average distance $R_0$ of the radar target from the phase center of the antenna and a half-width of the antenna of 2.1°:

$$w_{tr}(\xi) \approx \exp\left[-\left(\frac{\xi}{\xi_0}\right)^2\right] \tag{1.2.13}$$

where $$\xi_0 = R_0 \cdot \frac{2.1 \cdot \pi}{2 \cdot 180} \cdot 1.2 \approx 0.022 \cdot R_0$$

Consequently, for $R_0 \approx 115$ m it follows that $\xi_0 \approx 2.5$ m.

Finally, from a combination of the transversal and the longitudinal weighting functions, the following results:

$$w = w_{tr} \cdot w_1 \quad (1.2.14)$$

$$\approx \exp\left\{-\left[\left(\frac{\xi}{\xi_0}\right)^2 - \left(\frac{\zeta}{\zeta_0}\right)^2\right]\right\}$$

APPENDIX 1.3

Discussion of the Effective Radar Cross Section for the Resolution Cell. Introduction of a Statistical Description According to Equation (1.2.8) of Appendix 1.2, above, the values for $U_v$ available after the FFT are given as follows:

$$U_v = \sum_{n=1}^{N} w(\vec{r}_n) e^{-j\Phi_n} \sqrt{\sigma_n} \quad (1.3.1)$$

Thus, $U_v$ is the sum of the complex valued individual scattering contributions $e^{-j\Phi_n}\sqrt{\sigma_n}$ weighted with $w(\vec{r}_n)$.

For $|U_v|^2$—this is the "effective radar cross section" for the selected resolution cell—it then follows:

$$|U_v|^2 = \sum_{n=1}^{N}\sum_{m=1}^{N} w(\vec{r}_n)w(\vec{r}_m)\sqrt{\sigma_n}\sqrt{\sigma_m}\, e^{-j(\Phi_n-\Phi_m)} \quad (1.3.2)$$

In the discussion of these results, the influence of the positive real function $w(\vec{r})$ and of the phases $\Phi_n - \Phi_m$ should advisably be considered separately.

The different spatial weighting of the individual amounts according to the function $w(\vec{r})$ is the result of the directional effect of the antenna 11 and the distance gate function. If one considers the locus of the phase center of the antenna $\vec{R}_A$ to be fixed and the antenna lobe pivoted and/or the distance gate parameter changed, the center of the resolution cell shifts. In Equations (1.3.1) and (1.3.2), this changes only the function $w(\vec{r})$ but not the phases $\Phi_n$. Since $w(\vec{r})$ is a function that "changes only slowly" together with the locus (3 dB—width > 1 m), under the mentioned conditions $U_v$ and $|U_v|^2$ ("effective radar will also be functions of the center of the resolution cell that change only slowly. With a fixed locus for the phase center and a stationary radar target, the dependence of the effective radar cross section $|U_v|^2$ on the position of the resolution cell can thus be described by "a few" parameters.

Let us now consider the case where $w(\vec{r})$ remains unchanged (stationary resolution cell) but the locus $\vec{R}_A$ of the phase center is changed. Since the phases $\Phi_n$ include additive contributions that are a function of the distance between phase center $\vec{R}_A$ and the locus of the "scatter center" $\vec{r}_n$, the following applies in Equation (1.3.2):

$$\Phi_n - \Phi_m = \dot{\omega}_0 - \frac{4\pi f_0}{c}[|\vec{R}_A - \vec{r}_n| - |\vec{R}_A - \vec{r}_m|] \quad (1.3.3)$$

$$\Phi_n - \Phi_m \approx \dot{\omega}_0 - \frac{4\pi f_0}{c}\left[(\vec{r}_m - \vec{r}_n)\cdot \vec{u}_r - \frac{1}{2}((\vec{r}_n)^2 - \right. \quad (1.3.4)$$

$$\left. (\vec{r}_n \cdot \vec{u}_r)^2)\frac{1}{R} - \frac{1}{2}((\vec{r}_m)^2 - (\vec{r}_m \cdot \vec{u}_r)^2)\frac{1}{R}\right]$$

where $\vec{u}_r$ is the unit vector and R is the distance from $\vec{R}_A$ to the center point of the resolution cell.

The phase differences $\Phi_n - \Phi_m$ are a function of $\vec{R}_A$. If one considers two scattering contributions whose locations are spaced transversely to $\vec{u}_r$ by the distance D, it is evident that a change in the aspect angle by $$\delta\alpha/\text{degrees} \approx 15 \cdot \frac{\lambda_0}{D} \quad (1.3.5)$$

(with R fixed) produces a change from constructive to destructive interference.

If one selects for D a diameter of the resolution cell about 2 m, $\lambda_0 = 3.2$ mm, it follows that $\delta\alpha \approx 1/40°$.

The effective radar cross section $|U_{84}|^2$ is thus a very "quickly variable" function of the aspect direction.

As long as R is no greater than $2D^2/\lambda_0$, the second term of Equation (1.3.4) cannot be neglected. Thus $|U_v|^2$ is also a function of R. For the above numerical values, R would have to be > 1.5 km in order for $|U_v|^2$ to be independent of R, that is for the radar probe to lie in the scattering field of the illuminated portion of the radar target.

From the above statements it is evident that the description of the dependence of $|U_v|^2$ on the locus of the phase center requires a "very large number" of parameters. Such a description is thus not applicable for the present case. Instead, a statistical model is introduced for the backscatter and this model is applicable in each case for a predeterminable aspect angle range (typically $\Delta\alpha = 3°$).

If one considers the total volume to be dived into volume regions and each partial region (center of the region: $\vec{r}_i$) has associated with it a coherent scattering contribution $\sqrt{\sigma_i^K}$ and a non-coherent scattering contribution $\sqrt{\sigma_i^{NK}}$, the following applies, according to Equation (1.3.2), for a fixed aspect direction:

$$|U_v|^2 = \sum_i w^2(\vec{r}_i)\sigma_i^{NK} + \sum_i\sum_j w(\vec{r}_i)w(\vec{r}_j)\sqrt{\sigma_i^K}\sqrt{\sigma_j^K}\, e^{j(\Phi_i - \Phi_j)} \quad (1.3.6)$$

If one now assumes that (1) within the selected aspect angle range, $\sigma_i^{NK}$ is independent of the aspect angle;
(2) the variation of $\sqrt{\sigma_i^{NK}}$ and $\sqrt{\sigma_j^{NK}}$ with the aspect angle is given within the predetermined range by the following distribution function:

$$\rho(\sqrt{\sigma_i^K}) = \frac{2\sqrt{\sigma_i^K}}{<\sigma_i^K>}\exp\left(-\frac{\sigma_i^K}{<\sigma_i^K>}\right)$$

and $$\rho(\sqrt{\sigma_j^K}) = \frac{2\sqrt{\sigma_j^K}}{<\sigma_j^K>}\exp\left(-\frac{\sigma_j^K}{<\sigma_j^K>}\right)$$

(Angle brackets "21 >" designate median);
(3) the following applies:

$$\rho(\Phi_j) = \frac{1}{2\pi} \text{ and } \rho(\Phi_i) = \frac{1}{2\pi} \text{ ; and}$$

(4) the variations of the different scattering contributions are statistically independent;
then the median of $|U_{84}|^2$ is:

$$<|U_v|^2> = \Sigma\, w^2(\vec{r_i})\,(<\sigma_i^{NK}> - <\sigma_i^K>) \quad (1.3.7)$$

and the variance is $$<(|U_v|^2 - <|U_v|^2>)^2> = \left(\sum_i w^2(\vec{r_i})<\sigma_i^K>\right)^2 \quad (1.3.8)$$

Consequently, the distribution function for $|U_v|^2$, that is, for the effective radar cross section associated with a fixed position of the resolution cell and a fixed aspect angle range, is the following:

$$\rho(|U_v|^2) = \frac{1}{A} \exp\left(-\frac{|U_v|^2 - B}{A}\right) \quad (1.3.9)$$

where $A = \Sigma\, w^2 <\sigma_i^K>$ and $B = \Sigma\, w^2 <\sigma_i^{NK}>$.

APPENDIX 1.4

Description of the Model Employed

A model of the back-scattering of the radar target is obtained from the back-scattering of I point sources (local radar cross sections). The data of the individual point sources each apply only for one fixed aspect angle range ($\Delta\alpha = 3°$ in azimuth) and thus change when this range changes. There are a total of $360/3 = 120$ different aspect angle ranges (or 60 if the radar target has a plane of symmetry).

Within one aspect angle range, the radar cross section $\sigma_i$ the $i^{th}$ point source is described by the superposition of a coherent component it $\sigma_i^K$ on an incoherent component $\sigma_i^{NK}$. The variation is here inserted as the aspect angle (in an azimuth within a range of 3° and with "sufficiently" great variation of the elevation angle by way of the following distribution function:

$$\rho(\sigma_i) = \frac{1}{<\sigma_i^K>} \exp\left[-\frac{\sigma_i - \sigma_i^{NK}}{<\sigma_i^K>}\right] \quad (1.4.1)$$

The scattering of a point source for an aspect angle range is thus described completely by two real parameters, namely the median of the coherent component $<\sigma_i^K>$ and the incoherent component $\sigma_i^{NK}$. It should be noted that the variance of $\sigma_i$ is related to $<\sigma_i^K>$ as follows:

$$<(\sigma_i - <\sigma_i>)^2> = <\sigma_i^K>^2 \quad (1.4.2)$$

A complete description of back-scattering over all aspect angle ranges thus requires the provision of $$I \times 120 \times 2$$

real parameters. This number is cut in half is there exists a plane of symmetry.

From these parameters, the distribution function for the sampling value $U_v$ introduced in Appendix 1.2 for the voltage in the frequency domain, which value is associated with a fixed aspect angle and a fixed position of the resolution cell, can be calculated in the following manner:

$$\rho(U_v^2) = \frac{1}{A} \exp\left(-\frac{|U_v|^2 - B}{A}\right) \quad (1.4.3)$$

where $$A = \sum_{i=1}^{I} w^2(\vec{r_i} - \vec{r_v})<\sigma_i^K> \quad (1.4.4)$$

and $$B = \sum_{i=1}^{I} w^2(\vec{r_i} - \vec{r_v})<\sigma_i^{NK}> \quad (1.4.5)$$

where $\vec{r_v}$ is the center of the resolution and $w^2(\ )$ is the weighting function defined according to Appendix 1.2 (directional effect of the antenna and time gate function). It should be considered that the median of $|U_v|^2$ is given as follows:

$$<|U_v|^2> = A + B \quad (1.4.6)$$

and the variance is given as follows:

$$<|U_v|^2 - <|U_v|^2>^2> = A^2 \quad (1.4.7)$$

APPENDIX 2

Continuous Calculation of Median and Variance

Calculation of median:

$$\bar{x}_N^{def} = \frac{1}{N} \sum_{n=1}^{N} x_n$$

for $N+1$ it then follows:

$$\bar{x}_{N-1} = \frac{1}{N+1} \sum_{n=1}^{N-1} x_n = \frac{1}{N-1}\left(\sum_{n=1}^{N} x_n + x_{N-1}\right)$$

(2.1)

$$\boxed{\bar{x}_{N-1} = \frac{1}{N-1}(N \cdot \bar{x}_N + x_{N-1})}$$

Calculation of variance:

$$S_N^{def} = \frac{1}{N} \sum_{n=1}^{N} (x_n - \bar{x}_N)^2$$

$$= \frac{1}{N}\left(\sum_{n=1}^{N} x_n^2 - 2\bar{x}_N \sum_{n=1}^{N} x_n + \sum_{n=1}^{N} \bar{x}_N^2\right)$$
$$\qquad N\bar{x}_N \qquad N\bar{x}_N^2$$

$$S_N = \frac{1}{N} \sum_{n=1}^{N} x_n^2 - \bar{x}_N^2$$

From this, it follows for $N+1$:

$$S_{N-1} = \frac{1}{N+1} \sum_{n=1}^{N+1} x_n^2 - \bar{x}_{N-1}^2$$

(2.2)

$$\boxed{S_{N-1} = \frac{1}{N-1}[N(S_N - \bar{x}_N^2) - x_{N-1}^2] - \bar{x}_{N-1}^2}$$

APPENDIX 3

Calibration Measurement

The radar backscatter model to be calculated later must correctly describe the absolute value of the radar cross section (median and variance at a given position of the resolution cell).

To accomplish this, a measurement must be made beforehand at a radar target (calibration radar target)
(1) whose (far field) radar cross section $\sigma_{ok}$ is known; and
(2) for which the antenna is disposed in the far scattering field.

In order to meet condition (2), the greatest geometrical transverse dimension of the calibration radar target DK must not be greater than $$D_{K.max} = \sqrt{\frac{\lambda_0 R_0}{2}}$$

where $R_0$ is the oblique distance between radar target and antenna. With $R_0 = 115$ m and $\lambda_0 = 0.32$ cm, it follows that $D_{K.max} = 43$ cm.

During pivoting of the antenna lobe and passage through the various distance gates (numbered $\nu$), the center of the resolution cell $\vec{r}_Z$ takes on various discrete local positions (see Equation (1.2.10)).

During the calibration measurement it must be ensured, under consideration of the expanse of the resolution cell, that the target is associated with that value for $|U_\nu|^2 = U_O^2$ (sampling value in the frequency domain) at which the center $\vec{r}_Z$ of the associated resolution cell is removed no further than about 30 cm in the beam direction and about 60 cm transversely to the beam direction from the "main scattering center" of the radar target. For an angle reflector this scattering center lies at the "tip of the pyramid".

In order to meet this condition, the measurement is repeated at various positions of the calibration radar target and the maximum value for $U_0^2 = \text{Max}[|U_\nu|^2]$ is stored. If one considers the voltage $U_\nu$ in Equation (1.2.8) to be standardized $U_0/\sqrt{\sigma_{ok}}$ for the extended radar target to be examined, Equation (1.2.11) will apply for the weighting function introduced there.

Within the scope of the calculation of the parameters for the back-scatter model, standardization of the data can be effected during the calculation of the local radar cross sections.

The invention now being fully described, it will be apparent to one of ordinary skill in the art that any changes and modifications can be made thereto without departing from the spirit or scope of the invention as set forth herein.

What is claimed is:

1. An arrangement for use in determining the effective radar backscatter cross section $\sigma_{eff}$ of a radar target as a function of the geometric position of the target with respect to a radar antenna comprising:
    a revolving target platform on which a radar target to be examined is disposed;
    a radar antenna platform;
    means for mounting said antenna platform for rotation about a rotation axis and for pivotal movement about two different axes that are respectively perpendicular to said rotation axis so that the entire radar target can be scanned successively in time; and
    a radar antenna disposed on said antenna platform outside of said axis of rotation of said antenna platform.

2. An arrangement as defined in claim 1, wherein said antenna has a main beam direction whose axis is inclined with respect to said rotation axis of said antenna platform, with the respective inclination angle $\delta$ being selected such that during the time periods in which the position of a resolution cell relative to the radar target changes only insignificantly, the aspect angle at which a phase center of said radar antenna is viewed from the radar target passes through a predetermined angle range with respect to azimuth $\alpha$ and elevation $\beta$.

3. An arrangement as defined in claim 2, further comprising means, including a radar system connected to said radar antenna, for the determination the effective radar backscatter cross section $\sigma_{eff}$ of a target on said revolving target platform.

4. An arrangement as defined in claim 3 wherein said radar system is one of an FM-CW system and a pulse Doppler radar system.

5. An arrangement as defined in claim 2 wherein said revolving target platform is a horizontal platform and said antenna platform is mounted so that it is above and laterally displaced from said revolving platform; and said axis of rotation of said antenna platform is oriented transerve to the axis of rotation of said revolving target platform.

6. A method of determining the effective radar backscatter cross section of a target while employing the arrangement as defined in claim 3, comprising the following steps:
    (a) measuring time-dependent radar echo signals u(t) from a target on the revolving platform as a function of the position of the antenna platform and the position of the revolving platform and subjecting the echo signals to a Fourier transform;
    (b) determining the median and variance from the echo data that belong to the respective (discretized) spatial position of the resolution cell and to the respective aspect angle range $\Delta\alpha$;
    (c) associating the medians and the variances with the respective center of the resolution cell for each aspect angle range to form a three-dimensional image function of the medians and a three-dimensional image function of the variances which are associated with predetermined geometrical positions of scattering centers $r_i$ representative of the back-scatter behavior of the target;
    (d) describing the point-shaped local radar cross sections per aspect angle range by the median of the radar cross section and its variance; and
    (e) from the information about the median and the variance of the local radar cross section, determining the median and the variance of the effective radar cross section with the aid of a weighting process for a given resolution cell and a given aspect angle range.

* * * * *